United States Patent [19]

Bianca et al.

[11] Patent Number: 5,749,458
[45] Date of Patent: May 12, 1998

[54] MINIATURE JUMPER SWITCH WITH WIRE CONTACT MAKER

[75] Inventors: Giuseppe Bianca, Temecula; Robert M. Bogursky, Encintas, both of Calif.

[73] Assignee: Auto Splice Systems, Inc., San Diego, Calif.

[21] Appl. No.: 751,030

[22] Filed: Nov. 15, 1996

Related U.S. Application Data

[63] Continuation-in-part of Ser. No. 606,368, Feb. 23, 1996, Pat. No. 5,620,086.
[51] Int. Cl.⁶ .................................................... H01H 15/06
[52] U.S. Cl. .................... 200/541; 200/540; 200/284; 200/537
[58] Field of Search .................................. 200/541, 540, 200/539, 538, 284, 282, 254

[56] References Cited

U.S. PATENT DOCUMENTS

| | | |
|---|---|---|
| 1,866,563 | 7/1932 | Hammell . |
| 2,239,426 | 4/1941 | Kimball . |
| 3,377,450 | 4/1968 | Grady, Jr. et al. . |
| 3,974,346 | 8/1976 | Keprda . |
| 3,982,807 | 9/1976 | Anhalt et al. . |
| 4,238,655 | 12/1980 | Vonder . |
| 4,277,663 | 7/1981 | Soes . |
| 4,926,012 | 5/1990 | de Beauvais et al. . |
| 5,369,237 | 11/1994 | Mejerl et al. . |
| 5,408,061 | 4/1995 | Martin . |

*Primary Examiner*—David J. Walczak

[57] ABSTRACT

A low profile, push-pull, jumper switch that relies on movement of an electrically-insulating switch housing to make and break the connection between two contact members mounted on the surface of a PCB or other substrate. The only metal used are the two contact members and a fixed wire in the housing. The wire is forced into contact with the contact members to electrically interconnect them by movement of the housing when placed in its closed-switch position. In a preferred embodiment, the two contact members are identical and are each constituted of a one-piece U-shaped metal member, with the U-bight depending from the housing and configured to be solderable to the PCB pads or through-holes and thus being fixed. The contact members are configured to latch the housing in its open-switch position or closed-switch position. The switch lends itself to SMT applications.

20 Claims, 6 Drawing Sheets

MINIATURE JUMPER SWITCH WITH WIRE CONTACT MAKER

RELATED APPLICATION

This application is a continuation-in-part of U.S. patent application, Ser. No. 08/606,368, filed Feb. 23, 1996, now U.S. Pat. No. 5,620,086.

The invention is directed to a miniature jumper switch for automatic placement on a printed circuit board (PCB) or the like.

BACKGROUND OF INVENTION

Jumpers or shunt connectors for configuring pinned electronic equipment are known in the art. See, for example, U.S. Pat. No. 5,337,468. Typically, they comprise small plastic housings containing spring clips on their interior designed to mount over and electrically short circuit two pins upstanding on a PCB and connected to other components on the PCB. With surface mount technology (SMT), the pins are replaced by flat electrically-conductive pads on the PCB, and thus a jumper for SMT would have to mount across adjacent pads and form an electrically-conductive connection between them.

Tape and reel supply of electrical parts for automatic pick-and-place by a mechanical or pneumatic device onto a PCB or similar device is well known in the art. See, for example, the description in copending U.S. application, Ser. No. 08/084,579. In the conventional system, a plastic carrier tape with sprocket holes along one or both edges is embossed to form a series of pockets into each of which is placed an electrical component. The assembly is then covered with a plastic strip and reeled up on a reel. During assembly of the PCB, the strip is unreeled, the plastic cover removed, and a pick-and-place head is used to contact and pick, for example, a SMT component out of a carrier pocket and place it in a desired position, usually under control of a computer, on one or more tinned PCB pads. The latter are usually provided with solder paste that acts to temporarily hold the SMT part onto the PCB pads during a subsequent solder reflow process which permanently bonds and electrically connects the part to the PCB circuitry via the pads. This system has been successfully used for many years.

With many prior art switches, an actuator is typically used to separate or allow to come into contact two switch contacts that extend outside a housing. The motion that makes or breaks the contacts is such that the contacts move in a path toward or away from each other, so that when actual contact is made or broken, the contacted areas simply separate; they do not rub or slide against one another to ensure that contamination or insulating films on the contacting faces are always removed. It is desirable that the action that makes and breaks the contacts involves a "wiping" action to remove the contaminates and surface oxides on the contact faces.

It is desirable to place jumpers, and in particular, SMT jumpers, by pick-and-place equipment in the same manner as other SMT components to reduce assembly costs. Moreover, there is a need in the art for miniature jumpers that occupy a minimum of valuable space on a PCB, especially lateral space, i.e., space parallel to the plane of the board. Still further, there is a need in the art for a miniature jumper that can be user-controlled to interconnect or disconnect adjacent pads on a PCB.

SUMMARY OF INVENTION

The principal object of the invention is a miniature switch that can controllably switch connections between adjacent pads on a PCB, that can be placed on a PCB by standard pick-and-place devices, and that is capable of low cost manufacture.

A further object of the invention is a miniature switch that can controllably switch connections between adjacent pads on a PCB, and that always involves a wiping action between the contact surfaces actually making and breaking the switch connections.

Another object of the invention is a miniature switch that can controllably switch connections between adjacent pads on a PCB, and that has a relatively simple construction in which the only motion required is in a direction generally perpendicular to the plane of the PCB.

These and other objects are achieved in accordance with one feature of the invention with a low profile, push-pull, jumper switch that relies on movement of the switch housing to make and break the connection between two spaced contact members mounted on the PCB or other substrate.

In accordance with a further feature of the invention, which contributes to its inexpensive manufacture, the only metal used are the two contact members, which are each brought into contact with a conductive region of the housing by movement of the housing when placed in its closed-switch position.

In a preferred embodiment of the invention for SMT or other applications, the two contact members are each constituted of a one-piece U-shaped metal member, with the U-bight depending from the housing and configured to be solderable to the PCB pads or PCB through-holes and thus being fixed. Means on the contacts latch the housing in its up open-switch position or down closed-switch position. Alternatively, the means can be used to latch the housing in its up closed-switch position or down open-switch position. These means can employ spring forces or housing or contact structure, or combinations.

In accordance with a further feature of the invention, when the housing is pushed down or pulled up and latched into its closed-switch position, the contact members at one end are each forced into a sliding contact with a fixed conductive rod-like member. The sliding action acts to provide a rubbing action which wipes the mating contact surfaces removing oxides or other contaminates, providing a more reliable switch.

In a further preferred embodiment, the contact members are configured such that the opposite contact ends are visible from the housing top when in its down position and serve as a visible flag of the switch condition.

In still a further preferred embodiment, a portion of the housing is configured with finger grip areas for easy user manipulation and is also provided with an exposed flat top surface for easy pick-up by a conventional vacuum pick-and-place device for placement onto a PCB in the normal manner.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

Figure 1:
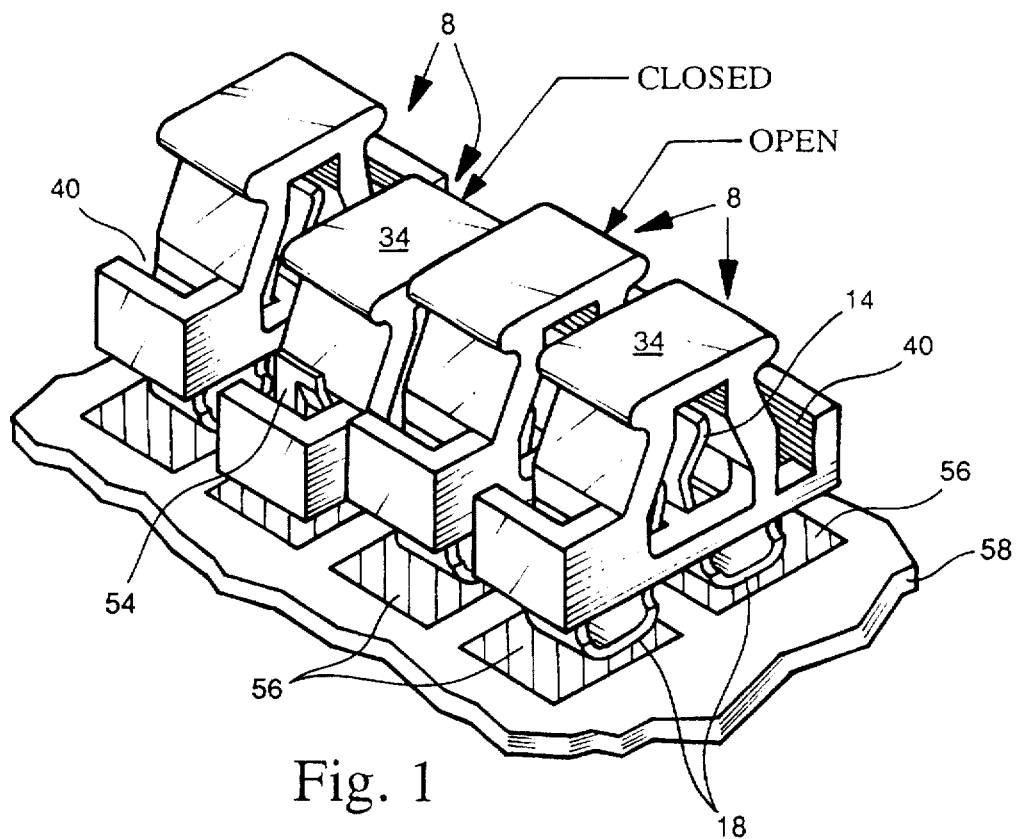
FIG. 1 shows in a schematic perspective view several jumper switches in accordance with one form of the invention soldered to pads on a part of a PCB.

One form of SMT jumper switch 8 in accordance with the invention is illustrated in FIGS. 2–5. It comprises two spaced, one-piece, generally U-shaped contact members 10, 12 of spring metal, such as of electrically-conductive brass or other copper alloy. Each contact member is bifurcated and comprises first 14 and second 16 arm portions on opposite sides of a bight portion 18. The bottom side 20 of the bight portion is relatively flat and configured for being soldered to a contact pad of a PCB. For this purpose, the bottom side 20 is tinned in the usual way. The two contact members extend vertically in the drawings, with the U facing upward.

Mounted on the two contact members is a one-piece electrically-insulating housing 22, preferably of plastic and made by molding. The housing 22 comprises a rectangular frame 24, open on both sides and with a center open region 26. On facing surfaces in the open region are provided cam surfaces 28, 30 that taper toward one another as the housing top is approached. The housing top is configured with finger grip areas 32 for finger gripping by a user, which finger grip areas are located just below a generally flat top surface 34 configured for receiving a suction head of standard pick-and-place equipment.

Figure 2:
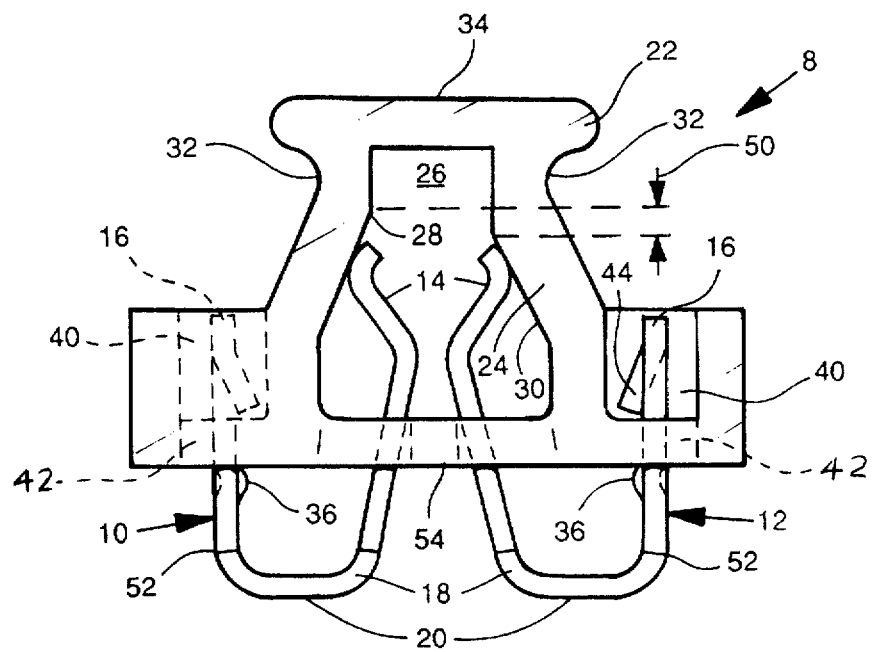
FIGS. 2 and 3 are front views of one of the jumper switches of FIG. 1 according to the invention in open and closed positions, respectively.

FIG. 2 shows the housing 22 in its up open-switch position, with the first contact arm portions 14 separated horizontally and with the housing resting by means of its cam surfaces 28, 30 on slightly bent ends of the arm portions 14. The spring forces exercised by the spring metal of the contact members 10, 12 maintain the arm portions 14 spaced laterally apart. The latter have a certain amount of stiffness which easily supports the light plastic housing 22. However, to provide additional protection against the housing moving downward accidentally, a protrusion in the form of a dimple 36 is formed in the second arm portions 16 above the flat surface 20. The housing has formed at its outer sides oppositely directed open sections 40 above a shelf at the housing bottom having apertures 42 through which pass the second arm portions 16. The configuration of the contact members 10, 12, the apertures 42, and the dimples 36 are such that the second arm portions 16 are pressed against the side walls of the apertures 42 producing an interfering relationship between the dimples 36 and the housing wall which, in the absence of a pushing force from above, will prevent the housing from moving downward. The housing in this stable open-switch position is positioned spaced from the bottom solderable surfaces 20. The upper end of the second arm portions 16 have bent-out tab portions 44 which, as is clear, interfere with the housing surfaces. These tab portions 44 serve as a housing lock and anti-over-travel device which prevents the housing 22 from being lost or accidentally lifted off and removed from the contact members 10, 12.

Figure 3:
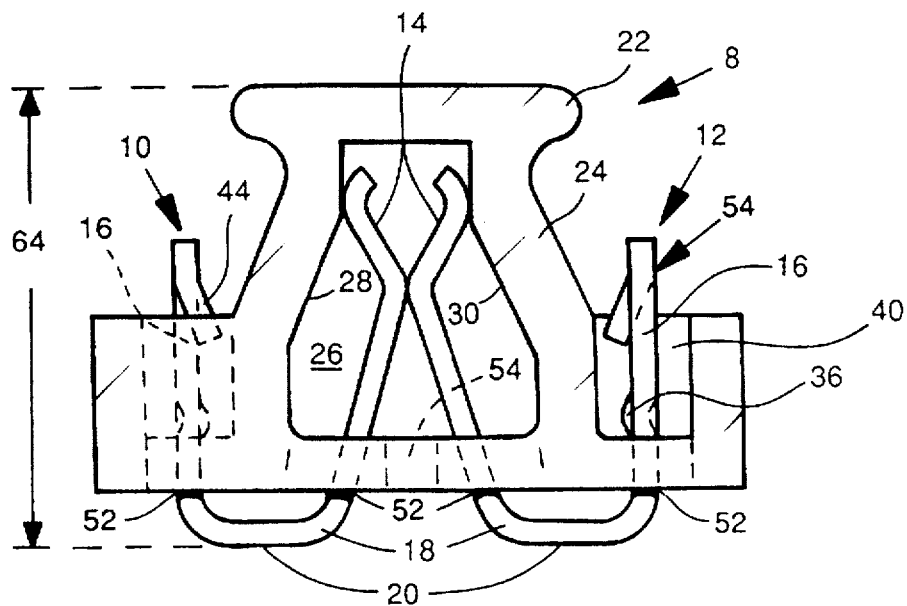

When the housing 22 is pushed down, either manually or automatically, with sufficient force that it rides over the dimple latches 36, it will position itself into a second stable closed-switch position illustrated in FIG. 3. Note that the dimple latches 36 are now inside the regions 40 and are held by the contact tension against the shelf of the housing wall preventing the housing from moving upward by itself As a result of the downward movement of the housing 22, the first arm portions 14 have been cammed into electrical contact with one another, and now the arm portions 14 are resting on non-tapered, generally parallel cam surfaces which avoids an excessive spring return force being applied to the housing to return it to its switch-open position. As will also be observed, the facing tapered cam surfaces 28, 30 are asymmetrical or vertically displaced with respect to one another. The vertical displacement is indicated by reference numeral 50. As a result, the contact between the facing parts of the first arm portions 14 is effected as a two-stage mating cycle in a sliding manner accompanied by a rubbing or wiping action which tends to remove oxide films or other contaminates. This wiping action is generated by differing the mating contour of the cam surfaces to displace the contacts at different rates. The first contact 14 at the right extends beyond a center line of the housing prior to engaging the second contact 14 at the left. When the left contact is cammed and arrives at the center, it must displace the right contact and push it back to the center, the final position shown in FIG. 3. This rubbing action wipes the contact mating area which assures the integrity of the electrical connection. The contacting area is preferably selectively plated with gold.

The housing 22 is also configured to limit the deflection of the spring contacts 14 and prevent them from being damaged by excessive stress. For example, in the closed-switch position, when the housing is in its down position, the bottom surfaces of the housing engage shoulders 52 close to or on the bight portions 20 of both contact members 10, 12. The shoulders 52 prevent further downward movement of the housing and assure that the first arm portions 14 never strike the housing interior at the top.

The housing 22 also has a contact separation member in the form of a separating wall 54 that lies between first arm portions 14 of the contact members and prevents accidental mating of the contacts when the housing is in its open-switch position. As mentioned, the housing remains in its open-switch position due to the spring loaded spring force of the contacts, and the dimples 36 secure that position.

The open sides of the housing facilitate cleaning of the switch contacts by flushing cleaning fluids through the openings to remove flux residues or other contaminates.

Figure 4:
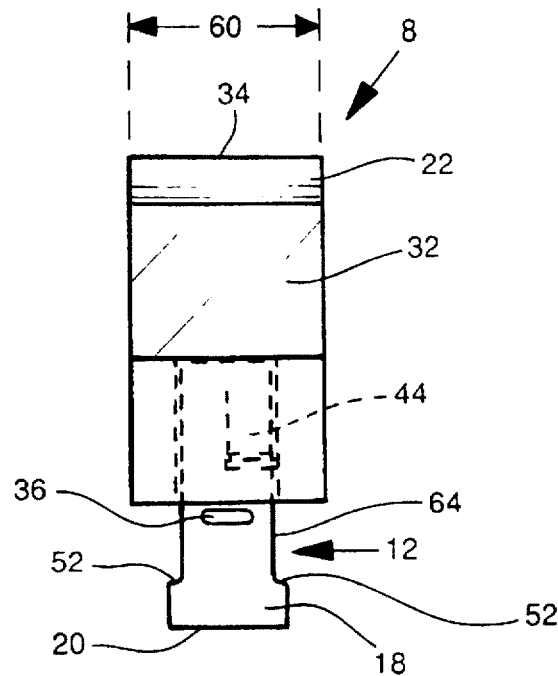
FIGS. 4 and 5 are end and top views, respectively, not to the same scale, of the switch illustrated in FIG. 2.
Figure 5:
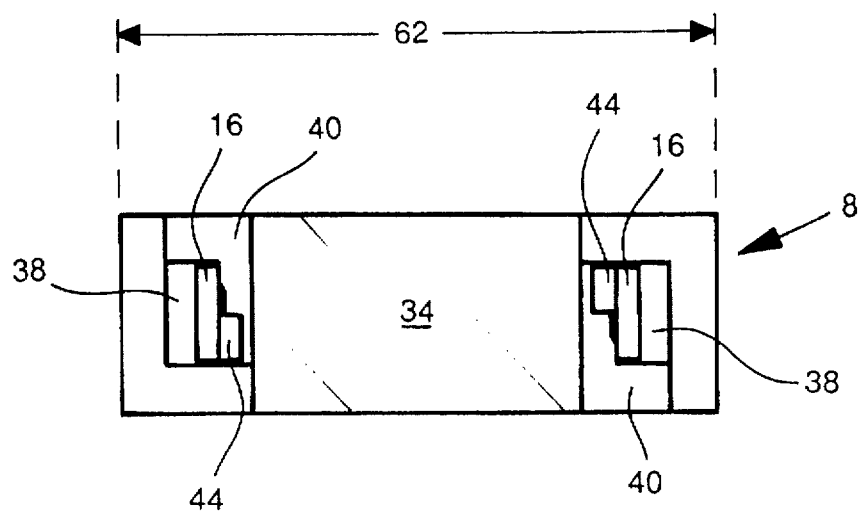

As illustrated in FIG. 4, the bight portion 20 is larger in width than the contact sections above it, referenced 64. The reduced size of the latter is used to take up any stresses imposed on the switch and thus prevents those stresses from being concentrated at and possibly breaking the soldered joint at the bight portions 20.

The length of the second arm portions 16 is chosen such that, when the housing is its open-switch position (FIG. 2), the arm ends are reasonably hidden below the top of the open sections 40, but when the housing is pushed down to its closed-switch position (FIG. 3), the arm ends are exposed 54 and protrude above the level of the open sections 40 and can serve as a visual "closed" flag providing visual evidence of the switch's closed condition. If desired, colors can be added to the housing to identify different PCB locations.

Figure 6:
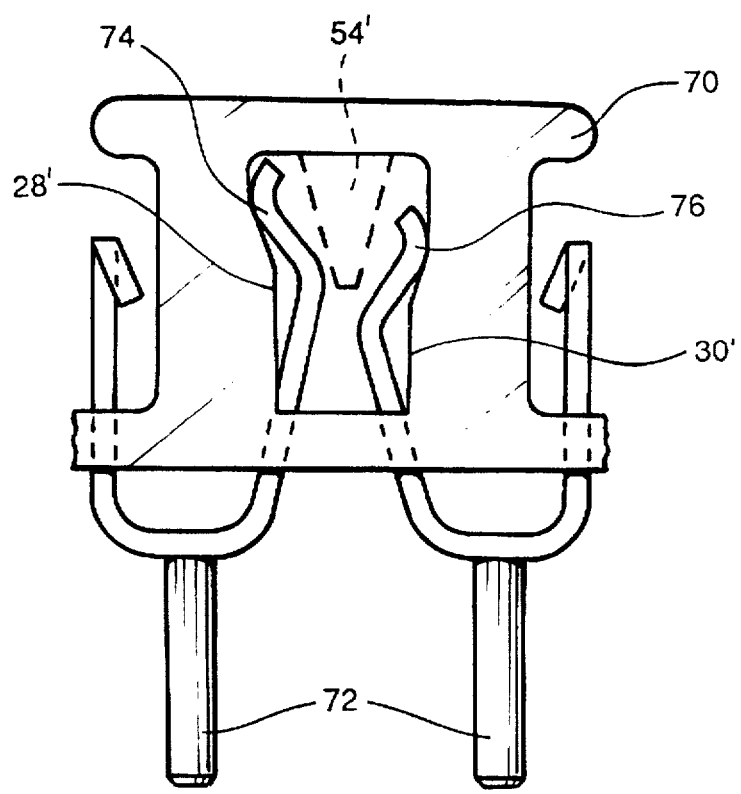
FIGS. 6 and 7 are front views of another form of jumper switch according to the invention in open and closed positions, respectively.
Figure 7:
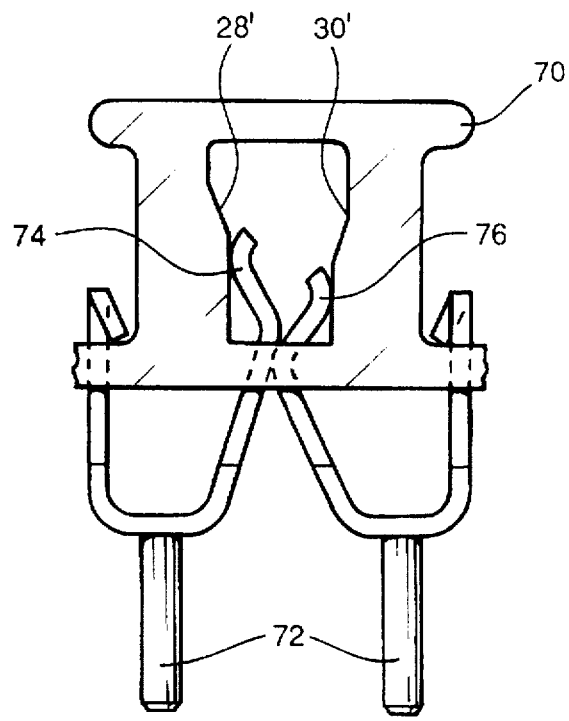

In the preferred embodiment so far described, the up position of the housing places the switch in its open-switch condition, and the down position of the housing places the switch in its closed-switch condition. This can be reversed. FIGS. 6 and 7 show a variant in which the up position of the housing (FIG. 7) places the switch in its closed-switch condition, and the down position of the housing (FIG. 6) places the switch in its open-switch condition. This is achieved by reversing the taper of the housing cam sections 28', 30'. The lower cam sections are parallel and forces the contacts together when the housing 70 is pulled up, whereas the upper cam sections are tapered outwardly so that the natural spring tension separates the contacts when the housing is pushed down. As with the first embodiment, structure 54', shown in phantom in FIG. 6, can be provided to ensure the contacts remain spaced laterally when the housing is placed in its down position.

It will also be understood that, while the preferred SMT embodiment has flat contact surfaces 20 for soldering to PCB pads, the bight portions 20 can also be provided with depending pins or posts 72 (FIGS. 6, 7) and thus the switch can be soldered via those pins 72 into the typical plated through-holes of a PCB for selectively making and breaking connections between adjacent through-holes. A switch with posts 72 that extend below the curved portion of the contact can be utilized in several different ways, such as: 1) to solder the posts in a through hole application where solder in the hole is the primary retention means (usually the solder joint would be below the PCB, soldered in a wave method); 2) to solder the SMT pads of the contact, while utilizing the posts as an alignment device, where the SMT pad solder joint is the primary retention means (the joint is on top of the PCB, created by solder paste, soldered by the IR method); or 3) use of the post 72 to act solely as a mechanical stiffening device.

FIGS. 6 and 7 also illustrate that the desired contact rubbing action can also be achieved with symmetrical cam surfaces 28', 30' but with asymmetrical contacts 74, 76. In this embodiment, the different lengths of the contact ends 74, 76 ensures that the shorter contact end 76 is cammed inwardly before the longer end 74, so that when the longer end 74 is cammed inwardly it pushes the shorter end back to the center producing the desired rubbing action.

Figure 8:
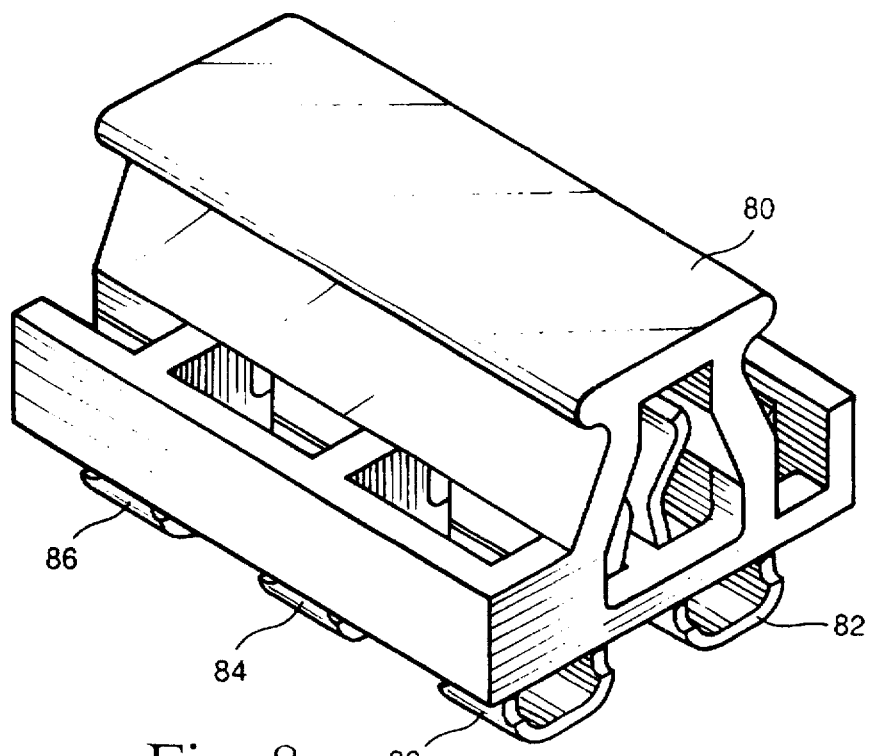
FIG. 8 is a perspective view of a ganged form of jumper switch according to the invention in its open position.

FIG. 1 illustrates four independent SMT switches 8 soldered into position on pads 56 of a PCB 58. Counting from the right side, the 1st, 2nd and 4th switches are in their open positions, and the 3rd switch is in its closed position. Alternatively, as shown in FIG. 8, plural switches can be ganged together by integrating their housings into a single housing 80 with multiple sets of contact members 82, 84, 86, with the result that movement of the common housing 80 causes simultaneous placement of all the switch pairs into their open-switch or closed-switch conditions.

The switch configuration lends itself to low cost manufacture (only 3 parts are needed) and can be given a low profile and be made with small pitch external contacts as well as small volume, as the depth (the horizontal dimension 60 in FIG. 4) need be not much larger than that of the contact members 10, 12. As an example only, the depth 60 can be about 1.6 mm, the length 62 about 4.8 mm, and the height 64 about 3.4 mm, for pad spacings on 2.5 mm centers. The displacement 50 can be about 0.4 mm.

The switches of the invention can be packaged in the pockets of the conventional carrier strip or in other equivalent ways and supplied in reel form to PCB assemblers. The molding plastic for the housing should be able to withstand the elevated temperatures of the standard reflow-soldering process that the PCB will be subject to. Molding plastics with this property are well known in the art and are available commercially from suppliers such as General Electric and DuPont. Other plastics will be obvious to those skilled in this art.

Figure 9:
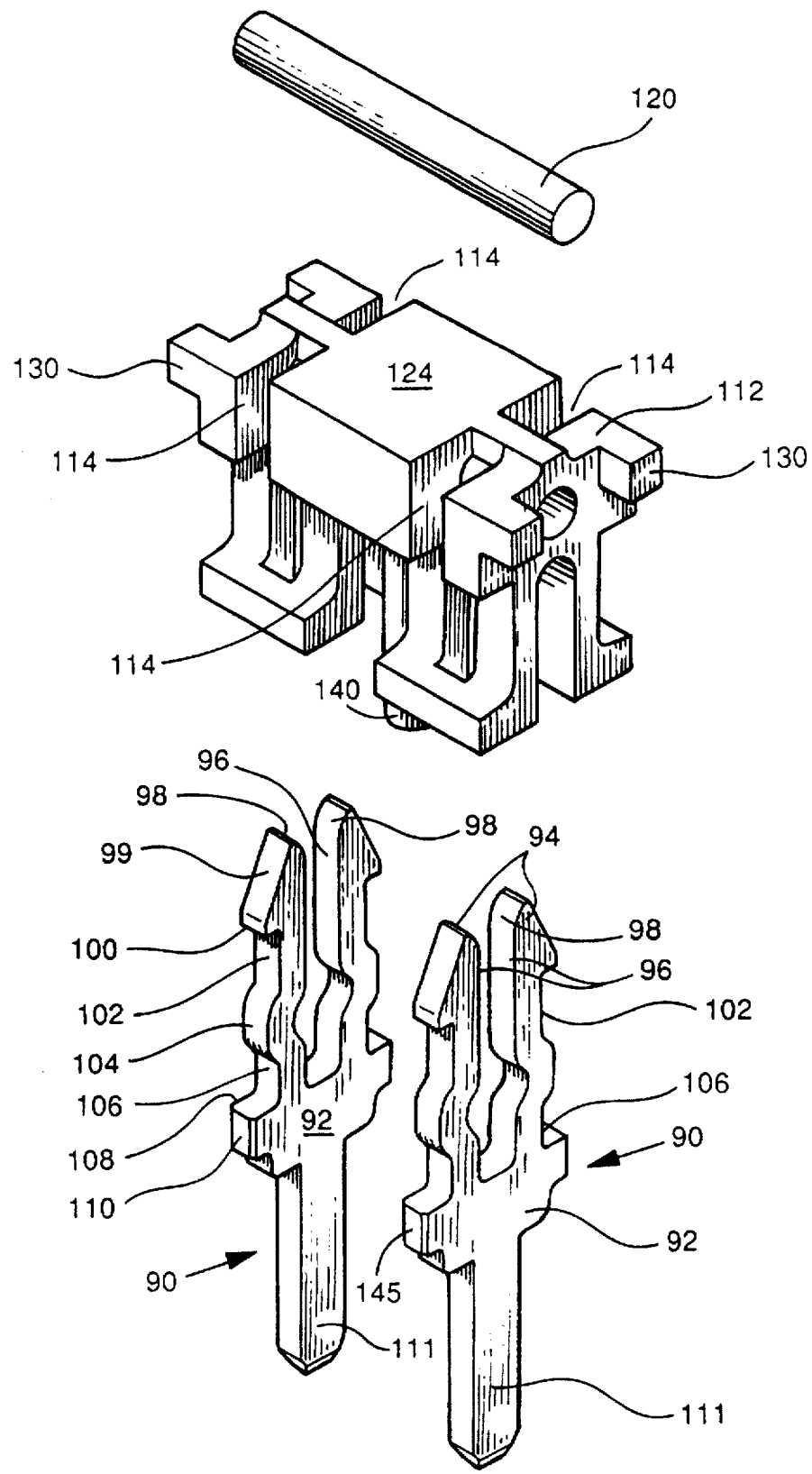
FIG. 9 is an exploded view of another embodiment of a jumper switch according to the invention.
Figure 10:
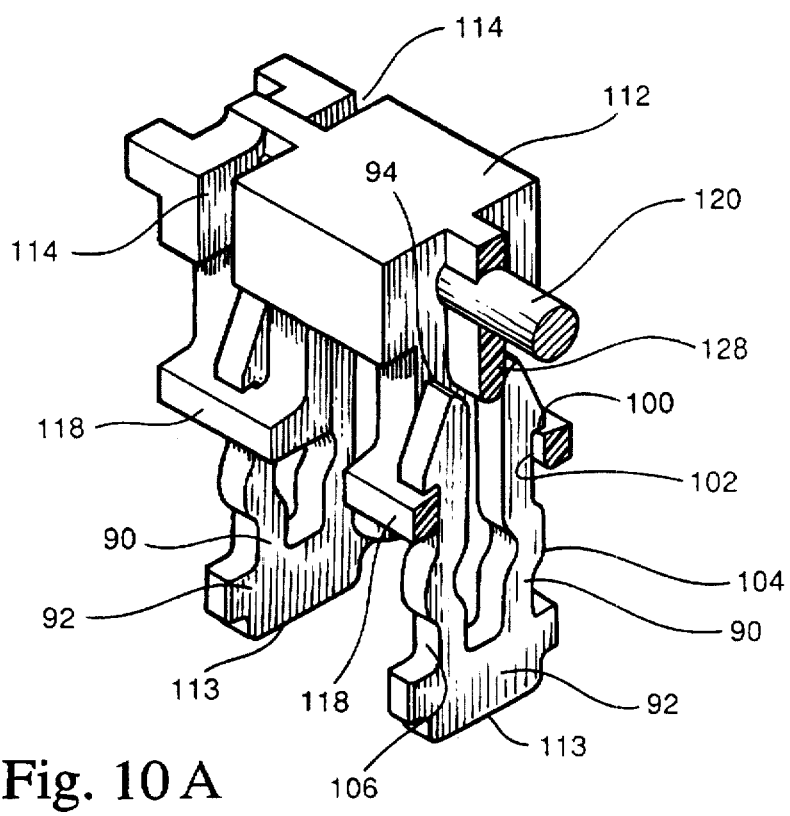
FIGS. 10A and 10B are perspective views, with part of the housing cut away to show interior details, of a variation of the embodiment illustrated in FIG. 9 in its open and closed positions, respectively.
Figure 10:
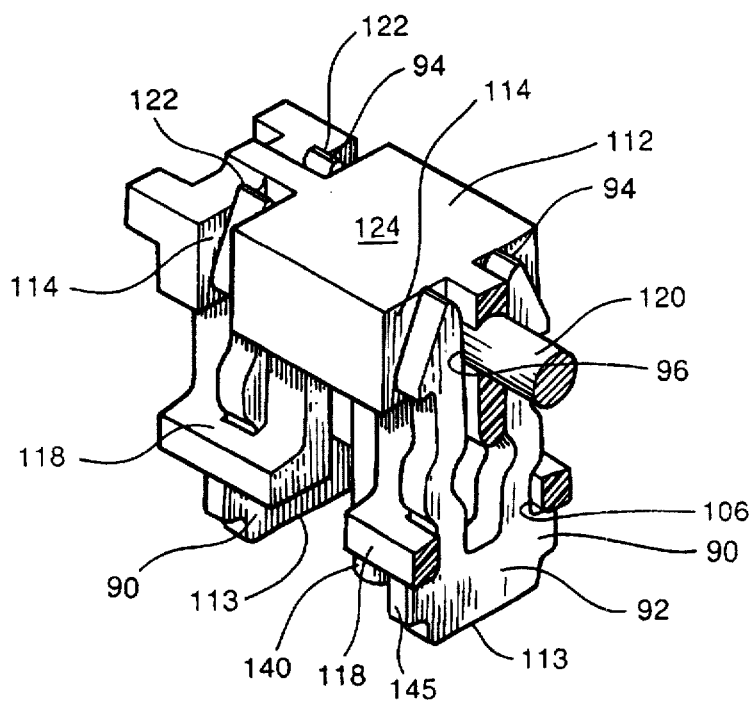

FIGS. 9 and 10A and 103B show other preferred embodiments of the invention which also feature small size, inexpensive manufacture, wiping contacts to remove contaminates and insulating films, and vertical movement, i.e., movement perpendicular to the PCB surface, of the housing relative to fixed contact members to make and break the contacts to minimize the switch footprint. However, in this embodiment, the wiping action is achieved by a wire-like member fixedly mounted in the housing and brought into and out of contact with the contact faces of spaced contact members when the housing is moved from its open contact position to its closed contact position and vice-versa.

The contact members in the embodiment of FIG. 9 comprise electrically-conductive bifurcated members 90 each in a generally tuning fork configuration comprising a bight portion 92 from which upstand facing tines 94 having on upper interior surfaces generally flat contact areas 96 which open outwardly to tapered regions 98 that taper outwardly toward the tuning fork opening. On the outside of the tines 94 are lateral first projections 99 forming, a horizontally extending first shelf 100 flanking a first recess 102 below, the other side of which first recess is flanked by a rounded lateral second projection or bump 104, forming below a second recess 106 whose bottom border is flanked in turn by a second shelf 108 formed by a lateral third projection 110. The bight portions 92 in the FIG. 9 embodiment are provided with downwardly-extending pins 11, similar to the pins 72 in the FIG. 6 embodiment, for engaging through-holes in a conventional PCB. In the FIGS. 10A and 10B embodiment, which is otherwise identical to the FIG. 9 embodiment, the bight portions 92 are adapted to surface mount by their bottom surfaces 113 on adjacent pads on a PCB or similar substrate, in the same manner as the surfaces 20 in the FIG. 2 embodiment. Hence, the contact members 90, in use, are fixed by soldering to the board surface. The contact members 90 are constituted of spring metal, such as brass or phosphor bronze, and extend vertically in their relaxed position. They can be outwardly or inwardly flexed, but will return to their relaxed vertical position when the stress is removed. Thus, the tines 94 will resist any movement tending to move them away from their relaxed position.

An electrically-insulating housing 112 mounts on the spaced contact members 90 and is configured on its interior, as shown, with spaced slots 114 into which the tines 94 of the contact members fit. The slot 114 sides are maintained open on the sides for cleaning purposes. The housing portion on the outside of the housing is configured to form an inwardly-projecting portion 118 sized to engage either of the two recesses 102, 106 on the tines 94. Inside an upper portion of the housing 112 is an electrically-conductive rod-like wire 120 which has a round shape with flattened ends and that extends perpendicular to the planes of the contact members 90, parallel to the PCB. The wire 120 is positioned in the housing 112 such that, in the open switch position of the housing shown in Fig. 10A, with the housing 112 in its raised position, the wire 120 is spaced above the contact members 90 and cannot make contact with its tines 94. In that position, the housing 112 is securely held in place by the housing projection 118 which engages the first upper recess 102. The first shelf 100 above prevents the housing from being lifted off of the contacts. The bump below formed by the rounded projections 104 prevents the housing from moving downwardly in the absence of external pressure and acts to provide an interfering engagement between the housing projections 118 and the tine sides.

When pushed down towards the PCB surface, the housing 112 rides over the rounded second projections 104 to engage with its projection 118 the second lower recess 106, as shown in FIG. 10B, and the wire 120 is then forced in between the tines 94 of both contact members 90 and the exposed surfaces of the wire 120 engage the contact surfaces 96. The tines 94 are flexed outwardly to allow this motion and return to an intermediate biased state when the motion is completed. The amount of tine deflection is limited to the outer diameter tolerance of the wire 120 molded into the housing 112. Choosing a precision wire ensures that excessive deflection will not occur and cause possible damage to the contact members. During this operation, it will be apparent that the wire 120, which extends horizontally, moves along a straight vertical path that is generally perpendicular to the wire's horizontal extension. Thus, the wire 120 moves along the tapered regions 98 and forces itself between the contact areas 96 of the tines by a wiping action capable of removing contaminates and insulating films. In this closed contact state with the housing in its lower position, the tines remain slightly flexed maintaining a pressure contact to the wire surfaces, electrically connecting the two contact members 90 together and thus the two pads that they are soldered on.

The housing 112 remains fixed in this second closed-switch position until the user pulls the housing 112 back up into its open switch position. The bumps 104 provide a tactile feel and an audible indication during the opening and closing operations. The height of the tines 94 or the height of the housing 112 (the vertical dimension in Figs. 10A and 10B) can be adjusted such that the upper tips 122 of the tines are visible to a user when the switch is in its closed position and less visible or invisible when the switch is in its open position. As will be observed, the top of the housing is provided with a flat area 124 serving as a vacuum pick-up area for use with pick and place equipment. As will also be observed, flexing of the tines is caused by entrance of the wire at the tines upper ends 98. By the spacing of the upper ends 98 from the bight 92, stresses are isolated from the solder joints at the bottom 111 or 113. If desired, stand-offs shown at 140 can be located on the housing bottom and configured so that the stand-offs contact the PCB surface when the housing 112 is in its lower closed position to maintain the main body of the housing above the PCB surface thus allowing access to the solder joints for cleaning and inspection. The stand-offs 140 can also limit the downward motion of the housing to prevent damage. While the relaxed position of the tines will keep the contact areas 96 spaced apart from one another in the open-switch position, if desired, an insulating part of the housing 128 can be provided located between the two contact areas 96 to prevent accidental mating of the contact members with the electrically conductive rod upon lateral movement of the housing when the switch is in its open position. It also aligns the housing to limit lateral motion during the mating cycle. As will be further observed, the housing can be provided with finger grips 130 at opposite ends for easy pulling of the housing from its closed to its open positions.

It is desirable for many applications that the shunt switch be as small as possible. To this end, for the contacts and housing in the FIG. 9 embodiment to be the minimal size, it is important that the tines 94 and the housing parts 118 share the deflection and forces required to snap the parts 118 over the interfering bumps 104 as the housing moves between its open-switch and closed-switch positions. Preferably, the contact members 90 and the housing spring rate are designed so that the contact tines 94 deflect about 0.001 inches for every 0.002 inches of deflection of the housing, or about one/half that of the housing. So, if the total displacement required to move the housing over the bumps 104 in the contacts 90 is about 0.010 inches, the contact tines 94 are designed to move inward about 0.0032 inches, and the housing beams 118 are designed to move outward about 0.0064 inches. This allows a smaller tine/beam in both the contact and housing to be used, because if either device were to absorb alone all of the deflection (i.e., 0.010 inches), the housing would have to absorb 56% more stress, or the contact would have to absorb 212% more stress, which could well exceed their respective elastic limits leading to a malfunction. By sharing the deflection, excessive deflection of either is avoided, and a smaller unit is possible.

The contact members 90 are readily stamped from a continuous strip of a plated copper alloy material, the plating being of a solderable element or compound, such as nickel, or tin-lead. By locating the carrier parts that support each of the contact members 90 at a position spaced above the surfaces 111, 113 that are soldered to the PCB, then the ends of the carrier parts that are severed to furnish discrete contact members and are unplated due to the severing will not interfere with the proper soldering of the contact members to the PCB pads. These severed unplated ends are shown at 145. The wire 120 can be molded directly into the housing 112 when formed as by molding of a suitably electrically-insulating plastic material. Hence, the sole metal parts in this preferred embodiment are the contact members 90 and wire 120.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A jumper switch comprising:
    a) a pair of contact members each having first contact portions and a second solderable portion,
    b) a switch housing mounted on and partially surrounding a portion of the contact members and wherein the entire housing is movable on the contact members from a first switch position to a second switch position to break and make, respectively, an electrical connection between the first contact portions of the two contact members,
    c) said second solderable portions extending out from the housing and configured for being soldered to conductive areas of external pads or through-holes,
    d) electrically-conductive means fixed on the housing and movable therewith for making contact to both of the first contact portions of the two contact members when the housing is in its second position.

2. A jumper switch as claimed in claim 1, wherein the electrically-conductive means comprises a wire fixed to the housing, said wire being spaced from and out of electrical contact with both of the first contact portions of the two contact members when the housing is in its first position.

3. A jumper switch as claimed in claim 2 wherein the contact members each extend in a flat plane, and the wire is straight and extends generally perpendicular to the plane of the contact members, and the two contact members are constituted of metal and constitute with the wire the only metal in the switch.

4. A jumper switch as claimed in claim 1, wherein the first position of the housing with respect to the contact members is located further away from the second solderable portions of the contact members than that of the second position of the housing.

5. A jumper switch as claimed in claim 1, wherein the contact members each comprise a generally bifurcated configuration having conductively connected resilient tines urged by spring forces into a spaced relaxed state.

6. An SMT jumper switch as claimed in claim 5, wherein the tine portions occupy a first position when the housing is in its first position and second position when the housing is in its second position, said tine portions being visible from a point outside of the housing when in its second position.

7. A jumper switch as claimed in claim 5, wherein the contact members and the housing are configured to prevent excessive deflection forces from exceeding the elastic limit of either of the conductive members or the housing.

8. A jumper switch as claimed in claim 7, wherein the contact members and the housing are configured such that any deflection of the contact members is matched by approximately twice the deflection of the housing.

9. A jumper switch as claimed in claim 1, wherein the housing has slightly flexible portions, and further comprising means including the slightly flexible portions providing interfering engagement of the housing with both of the contact members to maintain the housing in its first and second positions.

10. A jumper switch comprising:
   a) a pair of contact members each having first contact portions and a second solderable portion,
   b) a switch housing mounted on the contact members and movable on the contact members from a first switch position to a second switch position to break and make, respectively, an electrical connection between the first contact portions of the two contact members,
   c) said second solderable portions extending out from the housing and configured for being soldered to conductive areas of external pads or through-holes,
   d) electrically-conductive means on the housing and movable therewith for making contact to both of the first contact portions of the two contact members when the housing is in its second position,
   e) each contact member being constituted of a one-piece U-shaped metal member having first and second tine portions on opposite sides of a bight portion, the bight portion constituting the second solderable portion, the first and second tine portions having facing surfaces constituting the first contact portion.

11. An SMT jumper switch as claimed in claim 10, wherein the bight portion comprises a generally flat portion.

12. A jumper switch as claimed in claim 10, wherein the bight portion comprises a generally pin-shaped portion.

13. A jumper switch as claimed in claim 10, further comprising means on the first and second tine portions for latching the housing in its first and second positions.

14. A jumper switch as claimed in claim 13, wherein the means for latching comprises first, second and third projections, with the first and second projections positioned to interferingly engage portions of the housing in its first position and the second and third projections positioned to interferingly engage portions of the housing in its second position.

15. A jumper switch as claimed in claim 1, wherein the electrically-conductive means comprises a straight wire portion fixed to the housing for producing a sliding rubbing contact between the first contact portions of both of the contact members when the switch is moved into its second position.

16. A jumper switch as claimed in claim 1, wherein a portion of the housing is configured with finger grip areas for easy user manipulation.

17. A jumper switch as claimed in claim 1, wherein a portion of the housing is configured with an exposed flat top surface.

18. A jumper switch as claimed in claim 1, wherein the housing has open sides.

19. A jumper switch as claimed in claim 1, wherein the contact members are plated with a solderable coating except for two side portions located above the solderable portions.

20. A jumper switch as claimed in claim 1, wherein the housing is mounted to move in a straight path between its first and second positions, and the wire extends in a direction generally perpendicular to the straight path.

* * * * *